United States Patent
Lee et al.

(10) Patent No.: US 9,236,534 B2
(45) Date of Patent: Jan. 12, 2016

(54) LIGHT EMITTING DIODE PACKAGE, LIGHT SOURCE MODULE AND BACKLIGHT UNIT INCLUDING THE SAME

(71) Applicant: LG DISPLAY CO., LTD., Seoul (KR)

(72) Inventors: SeungJoon Lee, Gyeongsangbuk-do (KR); DongHun Lee, Gyeongsangbuk-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/277,237

(22) Filed: May 14, 2014

(65) Prior Publication Data

US 2015/0144969 A1    May 28, 2015

(30) Foreign Application Priority Data

Nov. 27, 2013    (KR) .................. 10-2013-0145536

(51) Int. Cl.
| | | |
|---|---|---|
| *H01L 33/48* | (2010.01) | |
| *H01L 27/15* | (2006.01) | |
| *F21V 8/00* | (2006.01) | |
| *H01L 33/62* | (2010.01) | |

(52) U.S. Cl.
CPC .............. *H01L 33/48* (2013.01); *G02B 6/0073* (2013.01); *H01L 27/153* (2013.01); *H01L 33/486* (2013.01); *H01L 33/62* (2013.01); *H01L 2224/48091* (2013.01); *H01L 2224/48247* (2013.01); *H01L 2224/48257* (2013.01); *H01L 2924/19107* (2013.01)

(58) Field of Classification Search
CPC .. G02B 6/0073; G02B 6/0083; H01L 33/486; H01L 2224/48091; H01L 2224/48247; H01L 2224/49109; H01L 2224/48257; H01L 2924/00014; H01L 33/48; H01L 33/62; H01L 27/153

See application file for complete search history.

(56) References Cited

U.S. PATENT DOCUMENTS

| | | | |
|---|---|---|---|
| 2002/0163068 A1* | 11/2002 | Asada | ........................... 257/690 |
| 2009/0224268 A1 | 9/2009 | Tsuchiya | |
| 2010/0252848 A1 | 10/2010 | Liang et al. | |
| 2012/0163026 A1* | 6/2012 | Jeon et al. | ...................... 362/612 |
| 2013/0105851 A1 | 5/2013 | Kim et al. | |

FOREIGN PATENT DOCUMENTS

| | | |
|---|---|---|
| JP | 2005-217644 A | 8/2005 |
| JP | 2009-218355 A | 9/2009 |
| KR | 100145841 B1 | 5/1998 |
| KR | 100169893 B1 | 10/1998 |
| KR | 2001-0046383 A | 6/2001 |

(Continued)

OTHER PUBLICATIONS

Office Action dated Nov. 25, 2014, for corresponding Korean Patent Application No. 10-2013-0145536.
Search Report dated Mar. 30, 2015, issued by the European Patent Office in European Patent Application No. 14169951.2.

(Continued)

*Primary Examiner* — Colleen A Matthews
*Assistant Examiner* — Quovaunda V Jefferson
(74) *Attorney, Agent, or Firm* — Morgan, Lewis & Bockius LLP (57) ABSTRACT

A light emitting diode package, a light source module and a backlight unit including the same are provided. A plurality of light emitting diode packages are arranged on a printed circuit board without interference therebetween, by forming lines therein.

17 Claims, 8 Drawing Sheets

(56) References Cited

FOREIGN PATENT DOCUMENTS

KR  10-2012-0070683  A     7/2012
WO  WO 2004/036660    *    4/2004

OTHER PUBLICATIONS

Japanese Office Action dated Sep. 27, 2015, issued by the Japanese Patent Office in Japanese Patent Application No. 2014-222750.

* cited by examiner

LIGHT EMITTING DIODE PACKAGE, LIGHT SOURCE MODULE AND BACKLIGHT UNIT INCLUDING THE SAME

Pursuant to 35 U.S.C. §119(a), this application claims the benefit of earlier filing date and right of priority to Korean Application No. 10-2013-0145536, filed on Nov. 27, 2013, the contents of which is incorporated by reference herein in its entirety.

BACKGROUND OF THE DISCLOSURE

1. Field of the Disclosure

The present disclosure relates to a light emitting diode package, and more particularly, to a light emitting diode package capable of reducing a size of a light source module by forming an additional line therein, a light source module and a backlight unit including the same.

2. Background of the Disclosure

Generally, a liquid crystal display (LCD) device has a small thickness, a light weight, and low power consumption. Due to such advantages, the LCD device is applied to a large television, etc., as well as a monitor, a notebook computer and a portable phone. Such LCD device includes a liquid crystal (LC) panel configured to display an image using an optical transmittance of liquid crystal molecules, and a backlight unit disposed below the LC panel and providing light to the LC panel.

The backlight unit includes a light source module configured to generate light to be provided to the LC panel. A light source of the light source module may include a Cold Cathode Fluorescent Lamp (CCFL), a Flat Fluorescent Lamp (FFL), a Light Emitting Diode (LED), etc.

The LED has characteristics of high light-emitting efficiency, long lifespan and low power consumption. Due to such characteristics, the LED is used as a light source of the light source module of the backlight unit. The LED is fabricated in the form of packages in which light emitting chips have been mounted, and is used as a light source of the light source module.

Figure 1A:
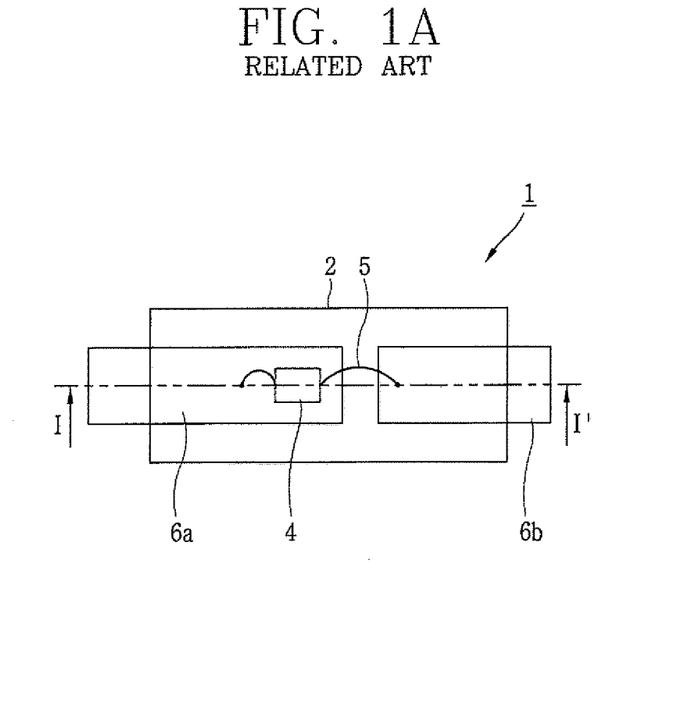
FIG. 1A is a schematic view illustrating a configuration of a light emitting diode (LED) package in accordance with the related art.
Figure 1B:
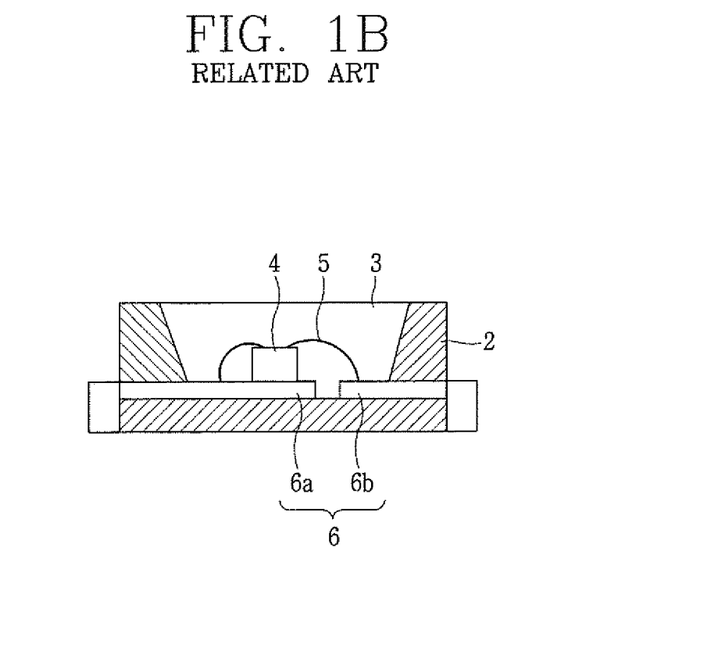
FIG. 1B is a sectional view taken along line I-I' in FIG. 1A.

FIG. 1A is a schematic view illustrating a configuration of a light emitting diode (LED) package in accordance with the related art, and FIG. 1B is a sectional view taken along line I-I' in FIG. 1A.

With reference to FIGS. 1A and 1B, the related art LED package 1 includes a lead frame 6 composed of two leads separated from each other, i.e., an anode lead 6a and a cathode lead 6b; and a LED chip 4 mounted on one surface of the lead frame 6.

The LED chip 4 is connected to the anode lead 6a and the cathode lead 6b of the lead frame 6, by a wire 5 formed of gold (Au), silver (Ag), etc.

The lead frame 6, the LED chip 4 and the wire 5 are enclosed by the case 2 formed of opaque resin, etc. Part of the anode lead 6a and the cathode lead 6b of the lead frame 6 is exposed to outside so as to be mounted on a printed circuit board (not shown).

The LED chip 4 enclosed by the case 2 is covered by a sealant 3 formed of transparent resin.

Figure 2:
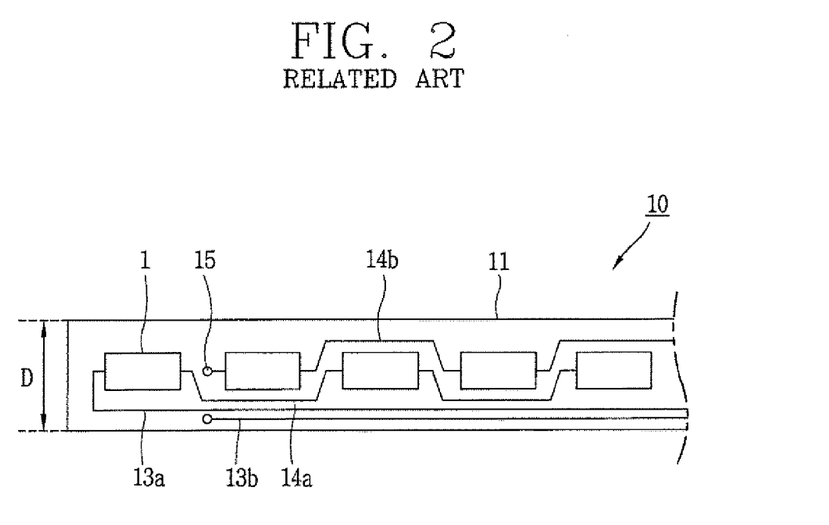
FIG. 2 is a view schematically illustrating a light source module in accordance with the related art.

FIG. 2 is a view schematically illustrating a light source module in accordance with the related art.

As shown in FIG. 2, a plurality of LED packages 1 are mounted on a printed circuit board 11, to thus constitute a light source module 10.

The plurality of LED packages 1 are implemented in the form of groups, which are called chains. In the related art light source module 10, an odd-numbered LED package 1 and an even-numbered LED package 1 among the plurality of LED packages 1 mounted on the printed circuit board 11 are arranged in groups with two chain structures.

That is, the light source module 10 has a plurality of LED packages 1 mounted on the printed circuit board 11 in groups with a first chain structure and a second chain structure. Each group is connected to lines formed at the printed circuit board 11, i.e., power supply lines 13a, 13b and connection lines 14a, 14b.

The first chain structure is composed of a first LED package 1 connected to the first power supply line 13a of the printed circuit board 11, a third LED package 1 connected to the first LED package 1 by the first connection line 14a, and a fifth LED package 1.

The second chain structure is composed of a second LED package 1 connected to the second power supply line 13b of the printed circuit board 11, and a fourth LED package 1 connected to the second LED package 1 by the second connection line 14b.

That is, the plurality of LED packages 1 having the first chain structure, and the plurality of LED packages 1 having the second chain structure are mounted on the printed circuit board 11 so that electrodes thereof can alternate each other in polarity. For instance, the first LED package 1 having the first chain structure has electrodes (+), (−), and the third LED package 1 connected to the first LED package 1 through the first connection line 14a has electrodes (−), (+). Further, the fifth LED package 1 connected to the third LED package 1 through the first connection line 14a has electrodes (+), (−). Under such configuration, the plurality of LED packages 1 having the first chain structure are connected to one another in serial.

The second chain structure is implemented in the same manner as the first chain structure. The first chain structure and the second chain structure are implemented in parallel.

In the related art light source module 10, as the number of chain structures of the LED packages 1 is increased, a width (D) of the printed circuit board 11 is increased.

For instance, in order to connect the plurality of LED packages 1 having the second chain structure to one another, in a state where the plurality of LED packages 1 having the first chain structure have been connected to one another through the first connection line 14a, the second connection line 14b should be formed at an upper end or a lower end of the LED package 1 having the first chain structure. Under such configuration, the width (D) of the printed circuit board 11 is increased.

Further, as the number of the chain structures of the LED packages 1 is increased, the printed circuit board 11 of the light source module 10 has a multi-layered structure. Accordingly, lines are formed even on a rear surface of the printed circuit board 11. Lines formed on a front surface of the printed circuit board 11 are connected to lines formed on a rear surface of the printed circuit board 11, through holes 15. As the number of chain structures is increased, the number of lines formed on the rear surface of the printed circuit board 11, and the length of the lines are increased.

The light source module 10 is accommodated in a side wall of an accommodating container (not shown) of the LCD device. As the LCD device becomes slim, the printed circuit board 11 of the light source module 10 has a limited width.

That is, in the related art light source module 10, as the number of chain structures of the LED package 1 is increased, the width (D) of the printed circuit board 11 is increased. To solve such problem, the printed circuit board 11 having a multi-layered structure is used. However, in this case, production cost of the light source module 10 is increased.

SUMMARY OF THE DISCLOSURE

Accordingly, the present disclosure is directed to a light emitting diode package that substantially obviates one or more of the problems due to limitations and disadvantages of the related art An object of the present invention is to provide a light emitting diode package capable of reducing a width of a printed circuit board of a light source module, by forming a line therein, a light source module and a backlight unit including the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of this specification, as embodied and broadly described herein, a light emitting diode package, comprises a light emitting diode chip configured to generate light; a case configured to accommodate therein the light emitting diode chip; lead frames spaced from each other in the case, and having an anode lead and a cathode lead electrically-connected to the light emitting diode chip; and at least one dummy lead frame spaced from the lead frames in an insulated state, and connected to each other in the case to form a line.

In another aspect, a light source module comprises a printed circuit board; and a plurality of light emitting diode packages are mounted sequentially arranged on the printed circuit board, having a first chain structure and a second chain structure, wherein each of the plurality of light emitting diode packages including light emitting diode chip configured to generate light, a case configured to accommodate therein the light emitting diode chip, lead frames spaced from each other in the case, and having an anode lead and a cathode lead electrically-connected to the light emitting diode chip, and at least one dummy lead frame spaced from the lead frames in an insulated state, and connected to each other in the case to form a line, wherein an output of one light emitting diode package having the first chain structure may be connected to another light emitting diode package having the first chain structure, through the dummy lead frame of an adjacent light emitting diode package having the second chain structure.

In another aspect, a light source module comprises a printed circuit board; and a plurality of light emitting diode packages are mounted sequentially arranged on the printed circuit board, having a first chain structure, a second chain structure and a third chain structure, wherein each of the plurality of light emitting diode packages including light emitting diode chip configured to generate light, a case configured to accommodate therein the light emitting diode chip, lead frames spaced from each other in the case, and having an anode lead and a cathode lead electrically-connected to the light emitting diode chip, and at least one dummy lead frame connected to each other in the case to form a line, wherein an output of one light emitting diode package having the first chain structure is connected to another light emitting diode package having the first chain structure, through the dummy lead frame of an adjacent light emitting diode package having the second chain structure and the dummy lead frame of the light emitting diode package having the third chain structure.

In another aspect, a backlight unit comprises a light source module; a light guiding plate arranged at one side of the light source module, and configured to guide light generated from the light source module; and an accommodation container configured to accommodate therein the light source module and the light guiding plate, wherein the light source module includes a printed circuit board; a plurality of light emitting diode packages are mounted sequentially arranged on the printed circuit board, having a first chain structure and a second chain structure, wherein each of the plurality of light emitting diode packages including light emitting diode chip configured to generate light; a case configured to accommodate therein the light emitting diode chip; lead frames spaced from each other in the case, and having an anode lead and a cathode lead electrically-connected to the light emitting diode chip; and at least one dummy lead frame connected to each other in the case to form a line, and wherein an output of one light emitting diode package having the first chain structure is connected to another light emitting diode package having the first chain structure, through the dummy lead frame of an adjacent light emitting diode package having the second chain structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure. In the drawings.

DETAILED DESCRIPTION OF THE DISCLOSURE

Reference will now be made in detail to the preferred embodiments of the present invention, examples of which are illustrated in the accompanying drawings. For the sake of brief description with reference to the drawings, the same or equivalent components will be provided with the same reference numbers, and description thereof will not be repeated.

Hereinafter, a light emitting diode (LED) package, a light source module and a backlight unit according to the present invention will be explained in more detail with reference to the attached drawings. In the present disclosure, a liquid crystal display (LCD) device will be explained for convenience. However, the present invention may be applicable not only to a LCD device, but also to various flat display devices using a backlight unit.

Figure 3:
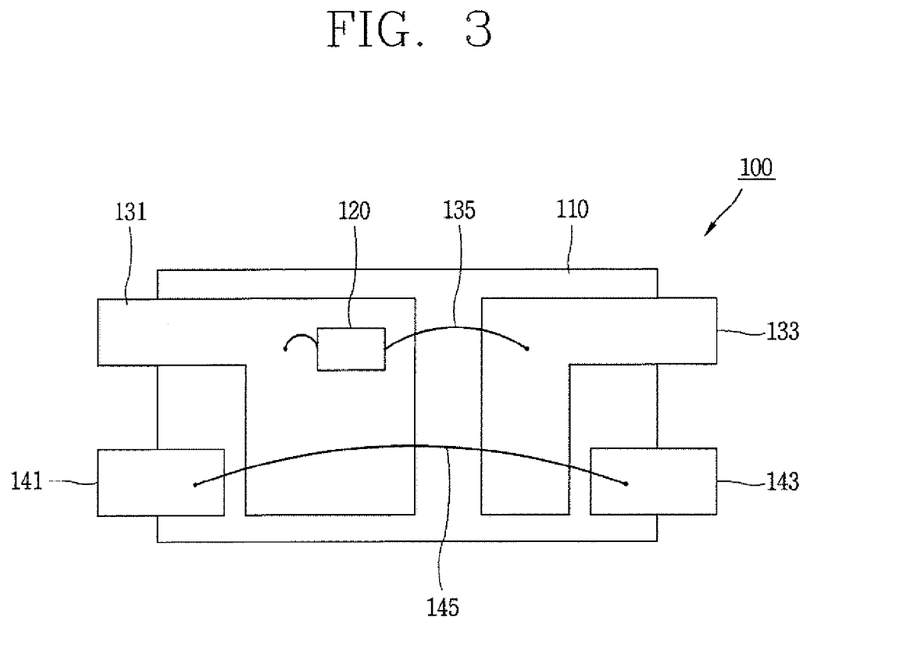
FIG. 3 is a view schematically illustrating a configuration of a light emitting diode (LED) package according to a first embodiment of the present invention.
Figure 4:
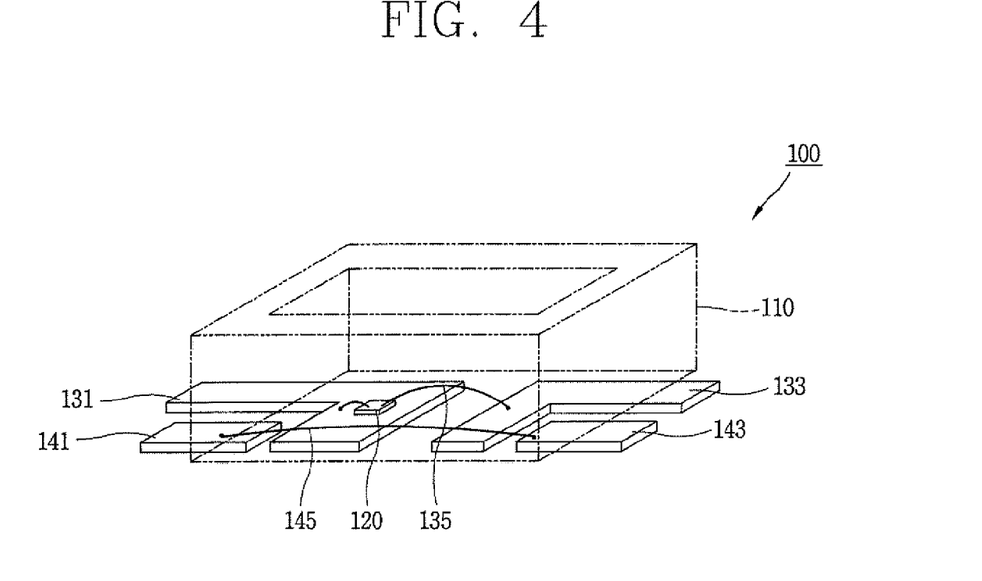
FIG. 4 is a perspective view of the LED package of FIG. 3.

FIG. 3 is a view schematically illustrating a configuration of a light emitting diode (LED) package according to a first embodiment of the present invention, and FIG. 4 is a perspective view of the LED package of FIG. 3.

As shown in FIGS. 3 and 4, the LED package 100 according to the first embodiment of the present invention may include a case 110, lead frames 131, 133, dummy lead frames 141, 143, and a LED chip 120.

The case 110 may be formed to have a 'U'-shape such that an upper surface is open. The case 110 may have an accommodation space for accommodating therein the lead frames 131, 133, the dummy lead frames 141, 143, and the LED chip 120. The case 110 may be formed of an insulating material such as polymer or ceramic, in order to insulate and protect the components accommodated therein.

A sealant (not shown), formed of a transparent resin, etc. in order to diffuse light generated from the LED chip 120, may be filled in the case 110. A reflecting material (not shown) may be coated on an inner side surface of the case 110.

The lead frames 131, 133 may include an anode lead 131 and a cathode lead 133. The anode lead 131 and the cathode lead 133 may be arranged at two sides of the case 110, so as to correspond to each other. The anode lead 131 and the cathode lead 133 may be electrically-insulated from each other in the case 110, in a spaced state from each other.

One end of each of the anode lead 131 and the cathode lead 133 may be exposed to outside of the case 110. For instance, one end of the anode lead 131 may be exposed to outside from one side wall of the case 110, and one end of the cathode lead 133 may be exposed to outside from another side wall of the case 110.

The LED chip 120 may be mounted on the anode lead 131 in the case 110. The LED chip 120 may be mounted on the anode lead 131 in a die-bonding manner by conductive epoxy. However, the present invention is not limited to this. In some cases, the LED chip 120 may be mounted on the cathode lead 133.

The LED chip 120 may be electrically-connected to each of the anode lead 131 and the cathode lead 133, through a first wire 135. For instance, an n-type electrode of the LED chip 120, i.e., an anode terminal may be connected to the anode lead 131 through the first wire 135. A p-type electrode of the LED chip 120, i.e., a cathode terminal may be connected to the cathode lead 133 through the first wire 135.

Although not shown, the LED chip 120 may be composed of an n-type semiconductor layer, a p-type semiconductor layer, a light emitting layer formed between the two semiconductor layers, an n-type electrode connected to the n-type semiconductor layer, and a p-type electrode connected to the p-type semiconductor layer.

More specifically, the LED chip 120 may be a GaN or GaN/AlGaN-based n-type semiconductor layer implemented as n-type semiconductor impurities have been doped on a substrate (not shown) formed of a transparent material such as sapphire, gallium nitride (GaN) and silicon carbide (SiC). The n-type semiconductor impurities may be silicon (Si), germanium (Ge) or tin (Sn).

A light emitting layer may be formed on the n-type semiconductor layer. The light emitting layer may be formed of a GaN-based material, and may have a single quantum well (SQW) structure or a multi quantum well (MQW) structure.

A GaN or GaN/AlGaN-based p-type semiconductor layer, implemented as p-type semiconductor impurities have been doped on a substrate, may be formed on an activation layer. The p-type semiconductor impurities may be magnesium (Mg).

The p-type semiconductor layer and the light emitting layer may be etched so that the n-type semiconductor layer can be partially exposed to outside. The n-type electrode may be formed on the n-type semiconductor layer exposed to outside by such etching. The p-type electrode may be formed on the p-type semiconductor layer having not been etched.

Once an electric field is applied to the LED chip 120 from outside through the n-type electrode and the p-type electrode, an electron and a hole may be provided to the light emitting layer from the n-type semiconductor layer and the p-type semiconductor layer. While the electron and the hole are re-coupled to each other at the light emitting layer, energy is generated. The energy may be converted into light, and the generated light may be emitted to outside.

The dummy lead frames 141, 143 may be spaced from the lead frames 131, 133, and may be electrically-insulated from each other. The dummy lead frames 141, 143 may include a first dummy lead 141 and a second dummy lead 143.

The first dummy lead 141 may be disposed at one side of the case 110, with a distance from the anode lead 131. The second dummy lead 142 may be disposed at another side of the case 110, with a distance from the cathode lead 133. The first dummy lead 141 and the second dummy lead 143 may be electrically-insulated from each other, in a spaced state from each other in the case 110.

One end of each of the first dummy lead 141 and the second dummy lead 143 may be exposed to outside of the case 110. For instance, one end of the first dummy lead 141 may be exposed to outside from one side wall of the case 110, and one end of the second dummy lead 143 may be exposed to outside from another side wall of the case 110. The exposed end of the first dummy lead 141 and the exposed end of the second dummy lead 143 may correspond to each other at two sides of the case 110.

The first dummy lead 141 and the second dummy lead 143 may be electrically-connected to each other in the case 110, through a second wire 145. More specifically, the first dummy lead 141 and the second dummy lead 143 are spaced from the lead frames 131, 133 in an insulated state from each other, and are connected to each other by the second wire 145. Accordingly, the first dummy lead 141 and the second dummy lead 143 may be formed as a single line in the LED package 100.

The LED package 100 according to the first embodiment of the present invention is provided therein with the dummy lead frames 141, 143 serving as additional lines. Accordingly, in a case where a plurality of LED packages 100 are mounted on a printed circuit board (PCB) of a light source module to be explained later, the number of lines formed on the PCB, or the length of the line can be reduced.

Figure 5:
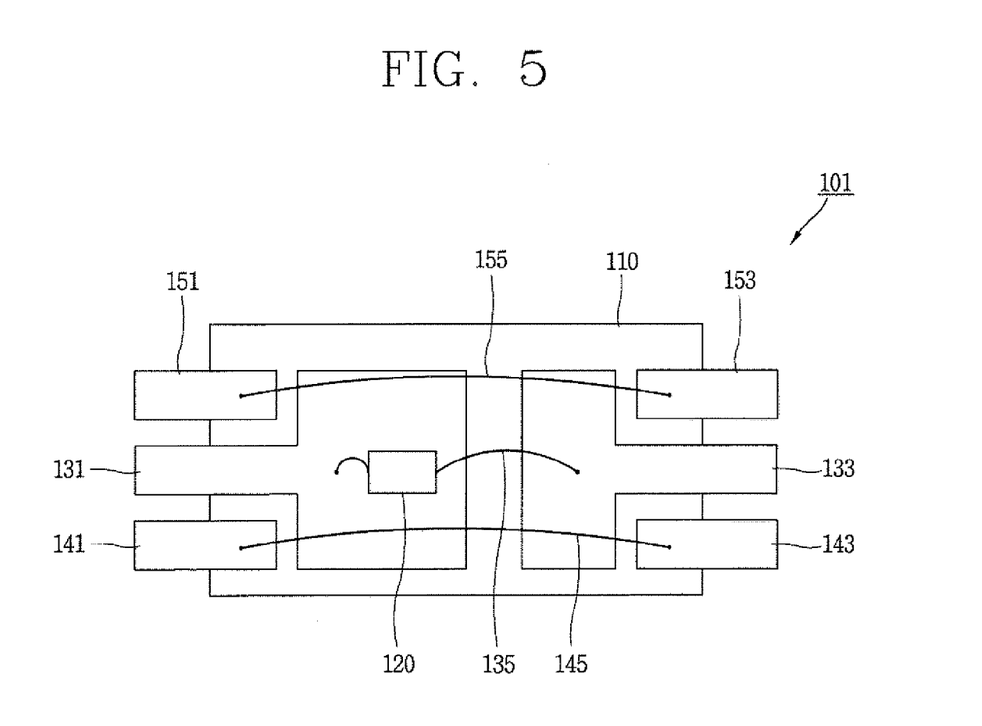
FIG. 5 is a view schematically illustrating a configuration of a light emitting diode (LED) package according to a second embodiment of the present invention.
Figure 6:
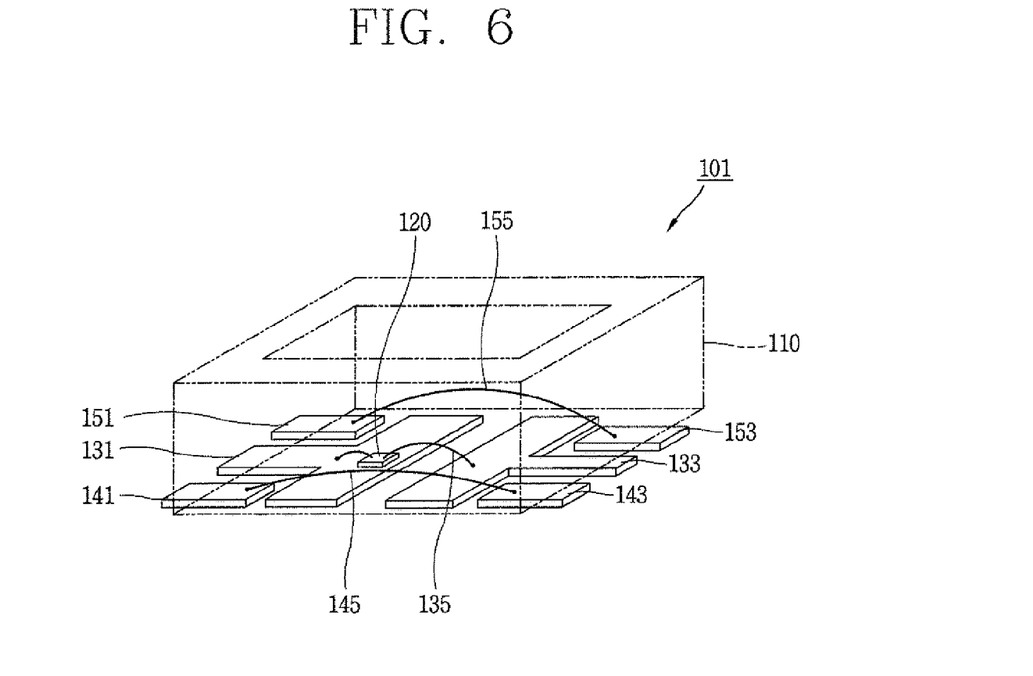
FIG. 6 is a perspective view of the LED package of FIG. 5.

FIG. 5 is a view schematically illustrating a configuration of a light emitting diode (LED) package according to a second embodiment of the present invention, and FIG. 6 is a perspective view of the LED package of FIG. 5.

With reference to FIGS. 5 and 6, the LED package 101 according to the second embodiment may include a case 110, lead frames 131, 133, first dummy lead frames 141, 143, second dummy lead frames 151, 153 and a LED chip 120.

The case 110 has an open upper surface, and accommodates therein the lead frames 131, 133, the first dummy lead frames 141, 143, the second dummy lead frames 151, 153 and the LED chip 120. A sealant may be filled in the case 110, and a reflecting material may be coated on an inner side surface of the case 110.

The lead frames 131, 133 may include an anode lead 131 and a cathode lead 133. The anode lead 131 and the cathode lead 133 are arranged at two sides of the case 110 in correspondence to each other, and may be electrically-insulated from each other in a spaced state from each other in the case 110. One end of the anode lead 131 may be exposed to outside from one side wall of the case 110, and one end of the cathode lead 133 may be exposed to outside from another side wall of the case 110.

The LED chip 120 may be mounted on the anode lead 131 in the case 110. The LED chip 120 may be electrically-connected to the anode lead 131 and the cathode lead 133 through the first wire 135. An anode terminal of the LED chip 120 may be connected to the anode lead 131 through the first wire 135, and a cathode terminal of the LED chip 120 may be connected to the cathode lead 133 through the first wire 135.

Each of the first dummy lead frames 141, 143, and the second dummy lead frames 151, 153 may be spaced from the lead frames 131, 133, and may be electrically-insulated from each other. The first dummy lead frames 141, 143 may include a first dummy lead 141 and a second dummy lead 143. The second dummy lead frames 151, 153 may include a third dummy lead 151 and a fourth dummy lead 153.

The first dummy lead 141 may be spaced from the anode lead 131 at one side of the case 110. The second dummy lead 143 may be spaced from the cathode lead 133 at another side of the case 110. The first dummy lead 141 and the second dummy lead 143 may be spaced from each other to thus be electrically-insulated from each other in the case 110.

The third dummy lead 151 may be spaced from the anode lead 131 and the first dummy lead 141 at one side of the case 110. The fourth dummy lead 153 may be spaced from the cathode lead 133 and the second dummy lead 143 at another side of the case 110. The third dummy lead 151 and the fourth dummy lead 153 may be spaced from each other to thus be electrically-insulated from each other in the case 110.

That is, the third dummy lead 151 may be arranged to face the first dummy lead 141 at one side of the case 110, in a state where the anode lead 131 is interposed between the first dummy lead 141 and the third dummy lead 151. The fourth dummy lead 153 may be arranged to face the second dummy lead 143 at another side of the case 110, in a state where the cathode lead 133 is interposed between the second dummy lead 143 and the fourth dummy lead 153.

One end of the first dummy lead 141 may be exposed to outside of the case 110, and one end of the second dummy lead 143 may be exposed to outside of the case 110. The exposed end of the first dummy lead 141 and the exposed end of the second dummy lead 143 may correspond to each other at two sides of the case 110.

One end of the third dummy lead 151 may be exposed to outside of the case 110, and one end of the fourth dummy lead 153 may be exposed to outside of the case 110. The exposed end of the third dummy lead 151 and the exposed end of the fourth dummy lead 153 may correspond to each other at two sides of the case 110.

The exposed first dummy lead 141 and the exposed third dummy lead 151 may face each other at one side of the case 110, in a state where the exposed anode lead 131 is interposed therebetween. The exposed second dummy lead 143 and the exposed fourth dummy lead 153 may face each other at another side of the case 110, in a state where the exposed cathode lead 133 is interposed therebetween.

The first dummy lead 141 and the second dummy lead 143 may be electrically-connected to each other in the case 110 through the second wire 145, and the third dummy lead 151 and the fourth dummy lead 153 may be electrically-connected to each other in the case 110 through a third line 155.

That is, the first dummy lead 141 and the second dummy lead 143 may be connected to each other in the case 110 through the second wire 145, thereby forming one single line. The third dummy lead 151 and the fourth dummy lead 153 may be connected to each other in the case 110 through the third line 155, thereby forming another single line.

The LED package 101 according to the second embodiment of the present invention is provided therein with two types of dummy lead frames serving as additional lines, i.e., the first dummy lead frames 141, 143 and the second dummy lead frames 151, 153. As a result, in a case where the LED package 100 is mounted on a printed circuit board (PCB), the number of lines formed on the PCB, or the length of the line can be reduced.

Figure 7:
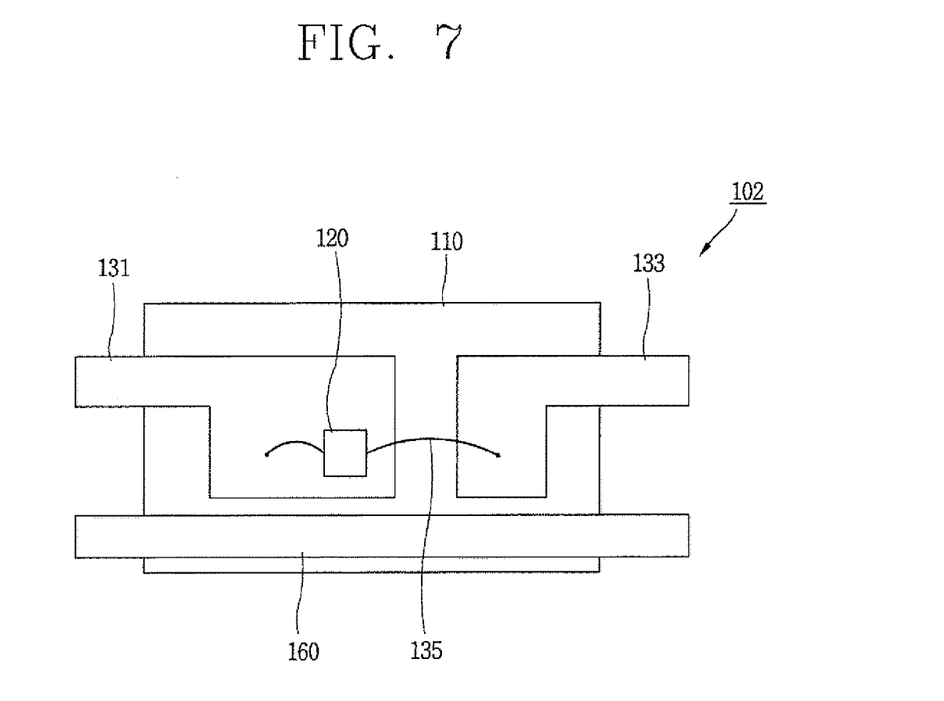
FIG. 7 is a view schematically illustrating a configuration of a light emitting diode (LED) package according to a third embodiment of the resent invention.
Figure 8:
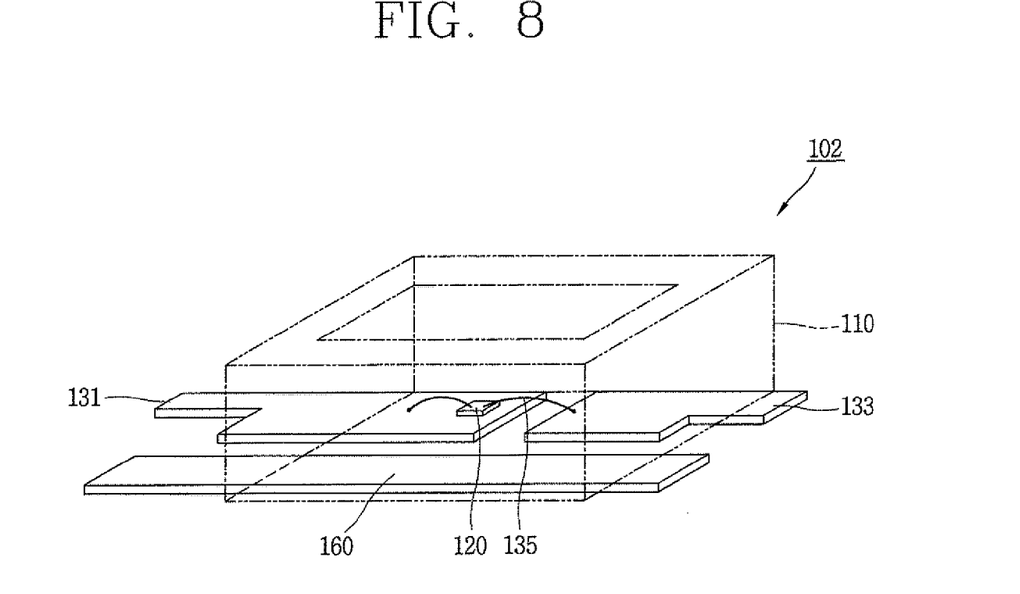
FIG. 8 is a perspective view of the LED package of FIG. 7.

FIG. 7 is a view schematically illustrating a configuration of a light emitting diode (LED) package according to a third embodiment of the resent invention, and FIG. 8 is a perspective view of the LED package of FIG. 7.

The LED package 102 according to the third embodiment is the same as the LED package 100 aforementioned with reference to FIGS. 3 and 4, except that a dummy lead frame 160 is integrally formed with the LED package 102. Accordingly, detailed explanations on the same components will be omitted.

With reference to FIGS. 7 and 8, the LED package 102 according to the third embodiment may include a case 110, lead frames 131, 133, a dummy lead frame 160 and a LED chip 120.

The case 110 has an open upper surface, and accommodates therein the lead frames 131, 133, the dummy lead frame 160 and the LED chip 120. A sealant may be filled in the case 110, and a reflecting material may be coated on an inner side surface of the case 110.

The lead frames 131, 133 may include an anode lead 131 and a cathode lead 133. The anode lead 131 and the cathode lead 133 may be arranged at two sides of the case 110, so as to correspond to each other. The anode lead 131 and the cathode lead 133 may be electrically-insulated from each other in the case 110, in a spaced state from each other. One end of the anode lead 131 may be exposed to outside from one side wall of the case 110, and one end of the cathode lead 133 may be exposed to outside from another side wall of the case 110.

The LED chip 120 may be mounted on the anode lead 131 in the case 110. The LED chip 120 may be electrically-connected to the anode lead 131 and the cathode lead 133 through the first wire 135. An anode terminal of the LED chip 120 may be connected to the anode lead 131 through the first wire 135, and a cathode terminal of the LED chip 120 may be connected to the cathode lead 133 through the first wire 135.

The dummy lead frame 160 may be extending from one side of the case 110 to another side of the case 110 through inside of the case 110, thereby being integrally formed. The dummy lead frame 160 may be spaced from the lead frames 131, 133, and may be insulated from the lead frames 131, 133.

One side of the dummy lead frame 160 may be exposed to outside from one side wall of the case 110, and another side thereof may be exposed to outside from another side wall of the case 110.

Said one exposed side of the dummy frame 160 may be spaced from the anode lead 131 at one side of the case 110. Said another exposed side of the dummy frame 160 may be spaced from the cathode lead 133 at another side of the case 110.

Said one exposed side of the dummy frame 160 and said another exposed side of the dummy frame 160 may be may correspond to each other at two sides of the case 110.

That is, the LED package 102 according to the third embodiment is provided therein with the dummy lead frame 160 serving as an additional line. This can reduce the number of lines of a printed circuit board (PCB) on which the LED package 102 is to be mounted, or the length of the line.

In the third embodiment, the LED package 102 is provided therein with one dummy lead frame 160, thereby forming a line. However, the present invention is not limited to this. For instance, the LED package 102 may be provided therein with two dummy lead frames 160, thereby forming two lines. The two dummy lead frames 160 may be spaced from each other in an insulated state from each other. And the two dummy lead frames 160 may be arranged to face each other at two sides of the case 110, based on the anode lead 131 and the cathode lead 133.

Figure 9:
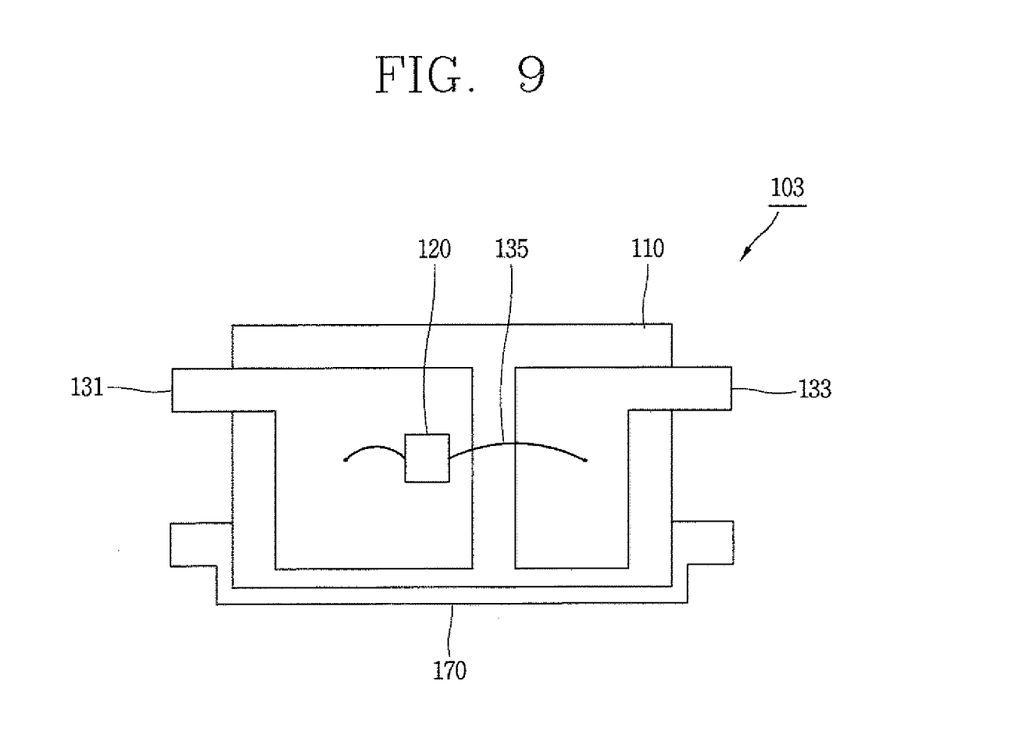
FIG. 9 is a view schematically illustrating a configuration of a light emitting diode (LED) package according to a fourth embodiment.
Figure 10:
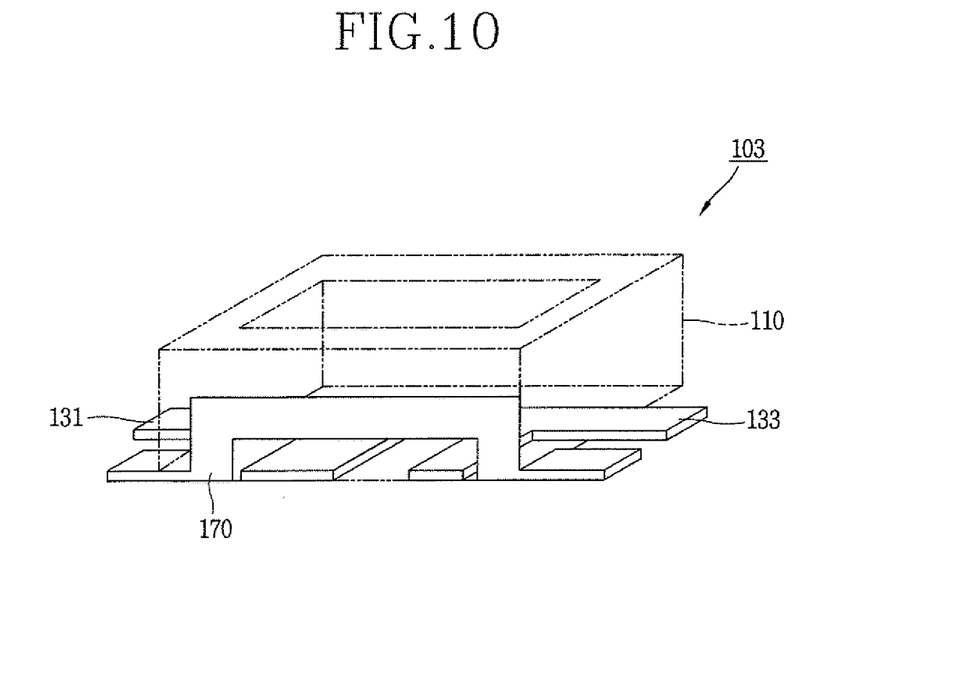
FIG. 10 is a perspective view of the LED package of FIG. 9.

FIG. 9 is a view schematically illustrating a configuration of a light emitting diode (LED) package according to a fourth embodiment of the resent invention, and FIG. 10 is a perspective view of the LED package of FIG. 9.

The LED package 103 according to the fourth embodiment is the same as the LED package 100 aforementioned with reference to FIGS. 3 and 4, except that a dummy lead frame 170 is formed on an outer surface of the LED package 103. Accordingly, detailed explanations on the same components will be omitted.

With reference to FIGS. 9 and 10, the LED package 103 according to the fourth embodiment may include a case 110, lead frames 131, 133, a dummy lead frame 170 and a LED chip 120.

The case 110 has an open upper surface, and accommodates therein the lead frames 131, 133 and the LED chip 120. A sealant may be filled in the case 110, and a reflecting material may be coated on an inner side surface of the case 110.

The lead frames 131, 133 may include an anode lead 131 and a cathode lead 133. The anode lead 131 and the cathode lead 133 may be arranged at two sides of the case 110, so as to correspond to each other. The anode lead 131 and the cathode lead 133 may be electrically-insulated from each other in the case 110, in a spaced state from each other. One end of the anode lead 131 may be exposed to outside from one side wall of the case 110, and one end of the cathode lead 133 may be exposed to outside from another side wall of the case 110.

The LED chip 120 may be mounted on the anode lead 131 in the case 110. The LED chip 120 may be electrically-connected to the anode lead 131 and the cathode lead 133 through the first wire 135. An anode terminal of the LED chip 120 may be connected to the anode lead 131 through the first wire 135, and a cathode terminal of the LED chip 120 may be connected to the cathode lead 133 through the first wire 135.

The dummy lead frame 170 may be extending from one side of the case 110 to another side of the case 110, along an outer surface of the case 110, thereby being integrally formed. One side of the dummy lead frame 170 may be spaced from the anode lead 131 at one side of the case 110. Another side of the dummy lead frame 170 may be spaced from the cathode lead 133 at another side of the case 110.

One side and another side of the dummy lead frame 170 may correspond to each other at two sides of the case 110.

That is, the LED package 103 according to the fourth embodiment is provided with the dummy lead frame 170 serving as an additional line, along an outer surface of the case 110. This can reduce the number of lines of a printed circuit board (PCB) on which the LED package 103 is to be mounted, or the length of the line.

In the fourth embodiment, the LED package 103 is provided with one dummy lead frame 170 along one outer surface of the case 110, thereby forming a line. However, the present invention is not limited to this. For instance, the LED package 103 may be provided with two dummy lead frames 170 along two outer surfaces of the case 110, thereby forming two lines.

Figure 11:
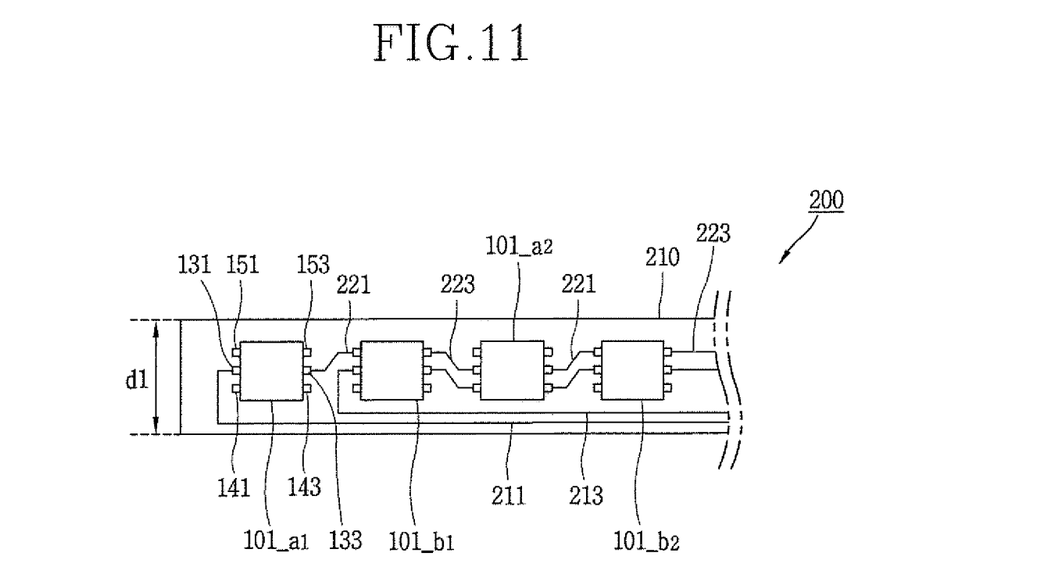
FIG. 11 is a view schematically illustrating part of a light source module according to a first embodiment.

FIG. 11 is a view schematically illustrating part of a light source module according to a first embodiment of the present invention.

In this embodiment, a light source module 200 using the LED package 101 aforementioned with reference to FIGS. 5 and 6 will be explained for convenience. However, the various LED packages according to the aforementioned embodiments may be applied to the light source module 200.

With reference to FIG. 11, the light source module 200 according to the first embodiment may include a printed circuit board (PCB) 210, and a plurality of light emitting diode (LED) packages 101_a1 to 101_b2 mounted on the PCB 210.

A plurality of lines may be formed on the PCB 210. For instance, a first power line 211 and a second power line 213, configured to supply operation power to the LED packages 101_a1 to 101_b2, respectively, may be formed on the PCB 210. A first connection line 221 and a second connection line 223, configured to connect the LED packages 101_a1 to 101_b2 to each other, may be formed on the PCB 210.

The first connection line 221 serves to connect a LED package 101_a1, 101_a2 having a first chain structure, with an adjacent LED package 101_b1, 101_b2 having a second chain structure. The second connection line 223 serves to connect a LED package 101_b1, 101_b2 having a second chain structure, with an adjacent LED package 101_a1, 101_a2 having a first chain structure.

As aforementioned with reference to FIGS. 5 and 6, the LED packages 101_a1 to 101_b2 are provided therein with first dummy lead frames 141, 143 and second dummy lead frames 151, 153 serving as two lines by being separately formed from the lead frames 131, 133.

The plurality of LED packages 101_a1 to 101_b2 may be mounted on the PCB 210 in an inline form. The plurality of LED packages 101_a1 to 101_b2 may have chain structures as a predetermined number of LED packages are formed in groups.

For instance, odd-numbered LED packages 101_a1, 101_a2, among the plurality of LED packages 101_a1 to 101_b2 mounted on the PCB 210, have a first chain structure as one group.

Even-numbered LED packages 101_b1, 101_b2, among the plurality of LED packages 101_a1 to 101_b2 mounted on the PCB 210, have a second chain structure as another group.

Under such configuration, the plurality of LED packages 101_a1, 101_a2 having the first chain structure, and the plurality of LED packages 101_b1, 101_b2 having the second chain structure may be sequentially mounted on the PCB 210. For instance, the plurality of LED packages 101_a1 to 101_b2 may be mounted on the PCB 210, in order of the first chain structure and the second chain structure.

The first chain structure may be implemented by the first LED package 101_a1 connected to the first power line 211 of the PCB 210, and the third LED package 101_a2 connected to the first LED package 101_a1 through the first connection line 221.

The second chain structure may be implemented by the second LED package 101_b1 connected to the second power line 213 of the PCB 210, and the fourth LED package 101_b2 connected to the second LED package 101_b1 through the second connection line 223.

The first LED package 101_a1 and the third LED package 101_a2 having the first chain structure may be mounted on the PCB 210 so that electrodes thereof can alternate each other in polarity. For instance, the first LED package 101_a1 of the first chain structure may be mounted on the PCB 210 so that electrodes thereof can be arranged in the form of (+), (−). On the contrary, the third LED package 101_a2 having the first chain structure may be mounted on the PCB 210 so that electrodes thereof can be arranged in the form of (−), (+). Likewise, the plurality of LED packages 101_b1, 101_b2 of the second chain structure may be mounted on the PCB 210 so that electrodes thereof can alternate each other in polarity.

Hereinafter, a method for connecting the plurality of LED packages 101_a1 to 101_b2 having the respective structures in the light source module 200 will be explained in more detail.

Firstly, the anode lead 131 of the first LED package 101_a1 having the first chain structure is connected to the first power line 211, thereby receiving operating power from outside. An output from the first LED package 101_a1 is provided to a third dummy lead 151 of the second LED package 101_b1 having the second chain structure, through the cathode lead 133 of the first LED package 101_a1 and the first connection line 221.

Then the output from the first LED package 101_a1 is provided to the cathode lead 133 of the third LED package 101_a2 having the first chain structure, through the third dummy lead 151 and the fourth dummy lead 153 connected to each other in the second LED package 101_b1, and through the second connection line 223.

That is, the output from the first LED package 101_a1 having the first chain structure may be provided to the cathode lead 133 of the third LED package 101_a2, through the second dummy lead frames 151, 153 of the second LED package 101_b1 having the second chain structure.

The anode lead 131 of the second LED package 101_b1 having the second chain structure is connected to the second power line 213, thereby receiving operating power from outside. An output from the second LED package 101_b1 is provided to a first dummy lead 141 of the third LED package 101_a2 having the first chain structure, through the cathode lead 133 of the second LED package 101_b1 and the second connection line 223.

Then the output from the second LED package 101_b1 is provided to the cathode lead 133 of the fourth LED package 101_b2 having the second chain structure, through the first dummy lead 141 and the second dummy lead 143 connected to each other in the third LED package 101_a2, and through the first connection line 221.

That is, the output from the second LED package 101_b1 having the second chain structure may be provided to the cathode lead 133 of the fourth LED package 101_b2, through the first dummy lead frames 141, 143 of the third LED package 101_a2 having the first chain structure.

As aforementioned, in the light source module 200 of the present invention, the plurality of LED packages 101_a1 to 101_b2 having different chain structures are connected to each other by using a line formed in an adjacent LED package, i.e., a dummy lead frame. This can allow a width (d1) of the printed circuit board (PCB) 210 to be reduced.

Under such configuration, the light source module 200 according to the first embodiment of the present invention can have the width (d1) of the PCB 210 more reduced than that of the related art light source module. Accordingly, production cost of the light source module 200 according to the first embodiment of the present invention can be reduced.

As the first LED package 101_a1 between the plurality of LED packages 101_a1 to 101_b2 mounted on the PCB 210 of the light source module 200, the related art LED package aforementioned with reference to FIGS. 1A and 1B may be used.

Figure 12:
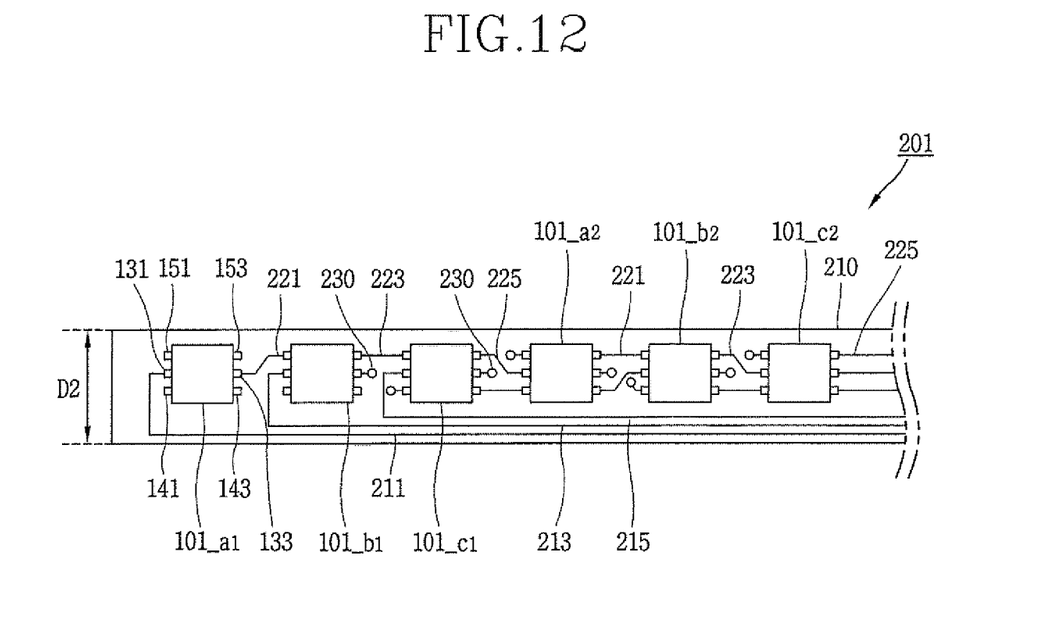
FIG. 12 is a view schematically illustrating part of a light source module according to a second embodiment.

FIG. 12 is a view schematically illustrating part of a light source module according to a second embodiment of the present invention.

In the light source module 201 according to the second embodiment, a plurality of LED packages 101_a1 to 101_c2 may be mounted on a PCB 210 with 3 chain structures.

More specifically, a first LED package 101_a1 and a fourth LED package 101_a2 among the plurality of LED packages 101_a1 to 101_c2 mounted on the PCB 210, may have a first chain structure as one group.

A second LED package 101_b1 and a fifth LED package 101_b2 among the plurality of LED packages 101_a1 to 101_c2 mounted on the PCB 210, may have a second chain structure as another group.

A third LED package 101_c1 and a sixth LED package 101_c2 among the plurality of LED packages 101_a1 to 101_c2 mounted on the PCB 210, may have a third chain structure as still another group.

Under such configuration, the plurality of LED packages 101_a1, 101_a2 having the first chain structure, the plurality of LED packages 101_b1, 101_b2 having the second chain structure, and the plurality of LED packages 101_c1, 101_c2 having the third chain structure may be sequentially mounted on the PCB 210. For instance, the plurality of LED packages 101_a1 to 101_c2 may be mounted on the PCB 210, in order of the first chain structure, the second structure and the third chain structure.

The plurality of LED packages 101_a1 to 101_c2 having different chain structures may be mounted on the PCB 210 so that electrodes thereof can alternate each other in polarity. More specifically, the first LED package 101_a1 and the fourth LED package 101_a2, the second LED package 101_b1 and the fifth LED package 101_b2, and the third LED package 101_c1 and the sixth LED package 101_c2 may be mounted on the PCB 210 so that electrodes thereof can alternate each other in polarity.

A plurality of lines may be formed on the PCB 210. For instance, a first power line 211, a second power line 213 and a third power line 215 for supplying operation power to the plurality of LED packages 101_a1 to 101_c2 may be formed on the PCB 210. Also, a first connection line 221, a second connection line 223 and a third connection line 225 for connecting the plurality of LED packages 101_a1 to 101_c2 to one another may be formed on the PCB 210.

The first connection line 221 serves to connect a LED package having a first chain structure, with an adjacent LED package having a second chain structure. The second connection line 223 serves to connect a LED package having a second chain structure, with an adjacent LED package having a third chain structure. The third connection line 225 serves to connect a LED package having a third chain structure, with an adjacent LED package having a first chain structure.

Hereinafter, a method for connecting the plurality of LED packages $101\_a1$ to $101\_c2$ having the respective chain structures in the light source module 201 will be explained in more detail.

Firstly, the anode lead 131 of the first LED package $101\_a1$ having the first chain structure is connected to the first power line 211, thereby receiving operating power from outside. An output from the first LED package $101\_a1$ is provided to a third dummy lead 151 of the second LED package $101\_b1$ having the second chain structure, through the cathode lead 133 of the first LED package $101\_a1$ and the first connection line 221.

Then the output from the first LED package $101\_a1$, which has been provided to the second LED package $101\_b1$, is provided to the third dummy lead 151 of the third LED package $101\_c1$ having the third chain structure, through the third dummy lead 151 and the fourth dummy lead 153 connected to each other in the second LED package $101\_b1$, and through the second connection line 223.

Then the output from the first LED package $101\_a1$, which has been provided to the third LED package $101\_c1$, is provided to the cathode lead 133 of the fourth LED package $101\_a2$ having the first chain structure, through the third dummy lead 151 and the fourth dummy lead 153 connected to each other in the third LED package $101\_c1$, and through the third connection line 225.

That is, the output from the first LED package $101\_a1$ having the first chain structure may be provided to the cathode lead 133 of the fourth LED package $101\_a2$, through the second dummy lead frames 151, 153 of the second LED package $101\_b1$ having the second chain structure, and through the second dummy lead frames 151, 153 of the third LED package $101\_c1$ having the third chain structure.

The anode lead 131 of the second LED package $101\_b1$ having the second chain structure is connected to the second power line 213, thereby receiving operating power from outside. An output from the second LED package $101\_b1$ is provided to a first dummy lead 141 of the third LED package $101\_c1$ having the third chain structure, through the cathode lead 133 of the second LED package $101\_b1$ and the second connection line 223.

A hole 230 is formed between the cathode lead 133 of the second LED package $101\_b1$ and the first dummy lead 141 of the third LED package $101\_c1$. The second connection line 223 is formed on a rear surface of the PCB 210, thereby connecting the cathode lead 133 of the second LED package $101\_b1$ to the first dummy lead 141 of the third LED package $101\_c1$ through the hole 230.

An output from the second LED package $101\_b1$, which has been provided to the third LED package $101\_c1$, is provided to the first dummy lead 141 of the fourth LED package $101\_a2$ having the first chain structure, through the first dummy lead 141 and the second dummy lead 143 connected to each other in the third LED package $101\_c1$, and through the third connection line 225.

The output from the second LED package $101\_b1$, which has been provided to the fourth LED package $101\_a2$, is provided to the cathode lead 133 of the fifth LED package $101\_b2$ having the second chain structure, through the first dummy lead 141 and the second dummy lead 143 connected to each other in the fourth LED package $101\_a2$, and through the first connection line 221.

That is, the output from the second LED package $101\_b1$ having the second chain structure may be provided to the cathode lead 133 of the fifth LED package $101\_b2$, through the first dummy lead frames 141, 143 of the third LED package $101\_c1$ having the third chain structure, and through the first dummy lead frames 141, 143 of the fourth LED package $101\_a2$ having the first chain structure.

The anode lead 131 of the third LED package $101\_c1$ having the third chain structure is connected to the third power line 215, thereby receiving power from outside. An output from the third LED package $101\_c1$ is provided to the third dummy lead 151 of the fourth LED package $101\_a2$ having the first chain structure, through the cathode lead 133 of the third LED package $101\_c1$ and the third connection line 225.

The hole 230 is formed between the cathode lead 133 of the third LED package $101\_c1$ and the third dummy lead 151 of the fourth LED package $101\_a2$. The third connection line 225 is formed on a rear surface of the PCB 210, thereby connecting the cathode lead 133 of the third LED package $101\_c1$ to the third dummy lead 151 of the fourth LED package $101\_a2$ through the hole 230.

The output from the third LED package $101\_c1$, which has been provided to the fourth LED package $101\_a2$, is provided to the third dummy lead 151 of the fifth LED package $101\_b2$ having the second chain structure, through the third dummy lead 151 and the fourth dummy lead 153 connected to each other in the fourth LED package $101\_a2$, and through the first connection line 221.

The output from the third LED package $101\_c1$, which has been provided to the fifth LED package $101\_b2$, is provided to the cathode lead 133 of the sixth LED package $101\_c2$ having the third chain structure, through the third dummy lead 151 and the fourth dummy lead 153 connected to each other in the fifth LED package $101\_b2$, and through the second connection line 223.

That is, the output from the third LED package $101\_c1$ having the third chain structure may be provided to the cathode lead 133 of the sixth LED package $101\_c2$, through the second dummy lead frames 151, 153 of the fourth LED package $101\_a2$ having the first chain structure, and through the second dummy lead frames 151, 153 of the fifth LED package $101\_b2$ having the first chain structure.

As the first LED package $101\_a1$ among the plurality of LED packages $101\_a1$ to $101\_c2$ mounted on the PCB 210 of the light source module 201, the related art LED package aforementioned with reference to FIGS. 1A and 1B may be used.

As aforementioned, in the light source module 201 according to the second embodiment, the plurality of LED packages $101\_a1$ to $101\_c2$ having various chain structures are connected to each other (i.e., the first LED package $101\_a1$ and the fourth LED package $101\_a2$ are connected to each other) by using at least one dummy lead frame formed in the adjacent LED packages. This can allow a width (d2) of the PCB 210 to be reduced.

Under such configuration, the light source module 201 according to the second embodiment of the present invention can have the width (d2) of the PCB 210 more reduced than that of the related art light source module. Accordingly, production cost of the light source module 201 according to the second embodiment of the present invention can be reduced.

In the light source module 201 according to the second embodiment, the PCB 210 has a double-layered structure where the holes 230 have been formed. The holes 230 are formed among the plurality of LED packages $101\_a1$ to $101\_c2$. As a result, a line, formed on a rear surface of the PCB 210 and connecting the holes 230 to each other, can have a shorter length than that in the related art light source module.

Figure 13:
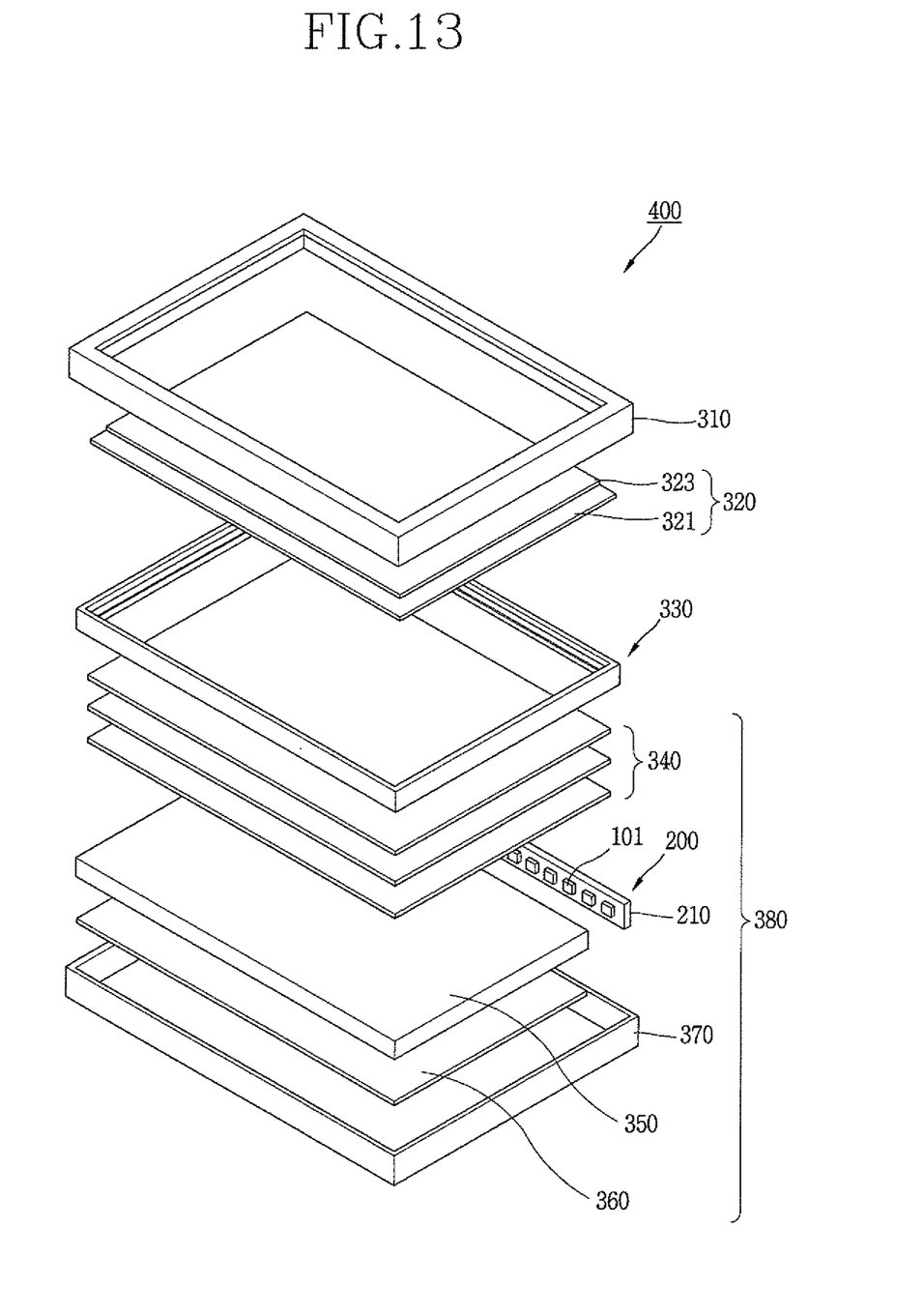
FIG. 13 is an exploded perspective view of a liquid crystal display device using a light source module.

FIG. 13 is an exploded perspective view of a liquid crystal display device using the light source module according to the present invention.

As shown in FIG. 13, the LCD device 400 of the present invention may include a top cover 310, a liquid crystal (LC) panel 320 and a backlight unit 380.

The top cover 310 is arranged on the LC panel 320, thereby protecting the LC Panel 320 from an external shock. A window, through which a display region of the LC panel 320 is exposed to outside, is formed at the top cover 310.

The LC panel 320 may include an array substrate 321, a color filter substrate 323 disposed to face the array substrate 321, and a liquid crystal layer (not shown) interposed between the array substrate 321 and the color filter substrate 323.

The backlight unit 380 may be disposed below the LC panel 320, thereby providing light to the LC panel 320.

The backlight unit 380 may include a light source module 200, a light guiding plate 350, an optical sheet 340, a reflection sheet 360 and a bottom cover 370.

The light source module 200 includes a plurality of LED packages 101, and a printed circuit board (PCB) 210 on which the LED packages 101 are mounted. The light source module 200 may have the same configuration as the light source module aforementioned with reference to FIG. 11 or FIG. 12.

The light source module 200 may be arranged on one or more sides of the light guiding plate 350, and may be accommodated into a side wall of the bottom cover 370.

The light guiding plate 350 may be arranged so as to be adjacent to the light source module 200, and may guide light generated from the light source module 200 to the LC panel 320.

The optical sheet 340 may be arranged above the light guiding plate 350 in plurality, and may provide light transmitted from the light guiding plate 350 to the LC panel 320 after increasing efficiency of the light. The optical sheet 340 may include a diffusion sheet, a prism sheet and a protection sheet.

The reflection sheet 360 may be disposed below the light guiding plate 350, and may reflect light leaked to a lower side of the light guiding plate 350 to the light guiding plate 350.

The bottom cover 370 may have a bottom surface and side walls, and may accommodate therein the reflection sheet 360, the light guiding plate 350, the light source module 200 and the optical sheet 340.

The backlight unit 380 may further include a guide panel 330. The guide panel 330 may be disposed between the LC panel 320 and the optical sheet 340, and may support the LC panel 320 together with the bottom cover 370. Also, the backlight unit 380 may fix the light guiding plate 350, the optical sheet 340 and the reflection sheet 360 to the bottom cover 370.

The LED package, the light source module and the backlight unit including the same can have a number of advantages. For example, a plurality of LED packages can be mounted on the PCB without interference therebetween, by using at least one line formed therein. This can reduce a width of the PCB of the light source module, and reduce production cost of the light source module.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

It will be apparent to those skilled in the art that various modifications and variations can be made in the light emitting diode package, light source module and backlight unit including the same of the present invention without departing from the spirit or scope of the invention. Thus, it is intended that the present invention cover the modifications and variations of this invention provided they come within the scope of the appended claims and their equivalents.

What is claimed is:

1. A light emitting diode package, comprising:
a light emitting diode chip configured to generate light;
a case configured to accommodate the light emitting diode chip therein;
lead frames spaced apart from each other in the case, the lead frames including an anode lead and a cathode lead electrically connected to the light emitting diode chip; and
a plurality of dummy lead frames spaced apart from the lead frames in an insulated state, the plurality of dummy lead frames being physically spaced apart from each other and electrically connected to each other in the case to form a line.

2. The light emitting diode package of claim 1, wherein the dummy lead frame comprises:
a first dummy lead spaced apart from the anode lead; and
a second dummy lead spaced apart from the cathode lead, the second dummy lead being electrically connected to the first dummy lead in the case through a wire.

3. The light emitting diode package of claim 2, wherein:
one end of the anode lead and one end of the cathode lead are exposed from two sides of the case;
one end of the first dummy lead is exposed from one side of the case to be spaced apart from the anode lead; and
one end of the second dummy lead is exposed from another side of the case to be spaced apart from the cathode lead.

4. The light emitting diode package of claim 1, wherein the dummy lead frame includes:
a first dummy lead and a third dummy lead, each spaced apart from the anode lead;
a second dummy lead spaced apart from the cathode lead, the second dummy lead being electrically connected to the first dummy lead in the case through a first wire; and
a fourth dummy lead spaced apart from the cathode lead and the second dummy lead, the fourth dummy lead being electrically connected to the third dummy lead in the case through a second wire.

5. The light emitting diode package of claim 4, wherein:
one end of the anode lead and one end of the cathode lead are exposed from two sides of the case;
one end of the first dummy lead and one end of the third dummy lead are exposed from one side of the case, to face each other with the anode lead interposed therebetween; and
one end of the second dummy lead and one end of the fourth dummy lead are exposed from another side of the case, to face each other with the cathode lead interposed therebetween.

6. A light emitting diode package, comprising:
a light emitting diode chip configured to generate light;
a case configured to accommodate the light emitting diode chip therein;
lead frames spaced apart from each other in the case, the lead frames including an anode lead and a cathode lead electrically connected to the light emitting diode chip; and a dummy lead frame spaced apart from the lead frames in an insulated state, wherein the dummy lead frame spans from one side of the case to another side of the case entirely on an outer surface of the case, the dummy lead frame being integrally formed.

7. A light source module, comprising:

a printed circuit board; and a plurality of light emitting diode packages mounted on the printed circuit board, the plurality of light emitting diode packages alternating in a first chain structure and a second chain structure, each of the plurality of light emitting diode packages including:
- a light emitting diode chip configured to generate light;
- a case configured to accommodate the light emitting diode chip therein;
- lead frames spaced apart from each other in the case, the lead frames including an anode lead and a cathode lead electrically connected to the light emitting diode chip; and
- at least one dummy lead frame spaced apart from the lead frames in an insulated state, such that, if there is more than one dummy lead frame in each package, the dummy lead frames are physically spaced apart from each other and electrically connected to each other in the case to form a line, wherein an output of the cathode lead in one light emitting diode package in the first chain structure is connected to the anode lead in another light emitting diode package in the first chain structure via the dummy lead frame of an adjacent interposing light emitting diode package in the second chain structure.

8. The light source module of claim 7, wherein an output of a first light emitting diode package in the first chain structure is connected to a third light emitting diode package in the first chain structure through the dummy lead frame of a second light emitting diode package in the second chain structure.

9. The light source module of claim 7, wherein an output of a second light emitting diode package in the second chain structure is connected to a fourth light emitting diode package in the second chain structure through the dummy lead frame of a third light emitting diode package in the first chain structure.

10. The light source module of claim 7, wherein each dummy lead frame of each of the plurality of light emitting diode packages includes:
- a first dummy lead spaced apart from the anode lead; and
- a second dummy lead spaced apart from the cathode lead, the second dummy lead being connected to the first dummy lead in the case through a wire.

11. The light source module of claim 7, wherein each dummy lead frame of each of the plurality of light emitting diode packages includes:
- a first dummy lead and a third dummy lead, each spaced apart from the anode lead;
- a second dummy lead spaced apart from the cathode lead, the second dummy lead being connected to the first dummy lead in the case through a first wire; and
- a fourth dummy lead spaced apart from the cathode lead and the second dummy lead, the fourth dummy lead being connected to the third dummy lead in the case through a second wire.

12. The light source module of claim 7, further comprising:

a first connection line on the printed circuit board, the first connection line being configured to connect an output of the plurality of light emitting diode packages in the first chain structure to the dummy lead frame of the plurality of light emitting diode packages in the second chain structure; and a second connection line on the printed circuit board, the second connection line being configured to connect an output of the plurality of light emitting diode packages in the second chain structure to the dummy lead frame of the plurality of light emitting diode packages in the first chain structure.

13. A light source module, comprising:

a printed circuit board; and a plurality of light emitting diode packages mounted sequentially on the printed circuit board, the plurality of light emitting diode packages being arranged in a first chain structure and a second chain structure, each of the plurality of light emitting diode packages including:
- a light emitting diode chip configured to generate light;
- a case configured to accommodate the light emitting diode chip therein;
- lead frames spaced apart from each other in the case, the lead frames including an anode lead and a cathode lead electrically connected to the light emitting diode chip; and
- at least one dummy lead frame spaced apart from the lead frames in an insulated state, such that, if there is more than one dummy lead frame, the dummy lead frames are physically spaced apart from each other and electrically connected to each other in the case to form a line, wherein the dummy lead frame of each of the plurality of light emitting diode packages extends from one side of the case to another side of the case entirely on an outer surface of the case, such that the dummy lead frame is integrally formed.

14. A light source module, comprising:

a printed circuit board; and a plurality of light emitting diode packages mounted sequentially on the printed circuit board, the plurality of light emitting diode packages being arranged in a first chain structure and a second chain structure, each of the plurality of light emitting diode packages including:
- a light emitting diode chip configured to generate light;
- a case configured to accommodate the light emitting diode chip therein;
- lead frames spaced apart from each other in the case, the lead frames including an anode lead and a cathode lead electrically connected to the light emitting diode chip; and
- at least one dummy lead frame spaced apart from the lead frames in an insulated state, such that, if there is more than one dummy lead frame, the dummy lead frames are physically spaced apart from each other and electrically connected to each other in the case to form a line, wherein an output of one light emitting diode package in the first chain structure is connected to another light emitting diode package in the first chain structure via the dummy lead frame of an adjacent light emitting diode package in the second chain structure, wherein the plurality of light emitting diode packages in the respective chain structures are on the printed circuit board, such that electrodes of the plurality of light emitting diode packages alternate each other in polarity.

15. A light source module, comprising:

a printed circuit board; and a plurality of light emitting diode packages mounted on the printed circuit board, the plurality of light emitting diode packages being sequentially arranged in a first chain structure, a second chain structure, and a third chain structure, each of the plurality of light emitting diode packages including:
- a light emitting diode chip configured to generate light;
- a case configured to accommodate the light emitting diode chip therein;
- lead frames spaced apart from each other in the case, the lead frames including an anode lead and a cathode lead electrically connected to the light emitting diode chip; and
- at least one dummy lead frame in the case, such that, if there is more than one dummy lead frame in each package, the dummy lead frames are connected to each other in the case to form a line,
- wherein an output of the cathode lead in one light emitting diode package in the first chain structure is connected to the anode lead in another light emitting diode package in the first chain structure via the dummy lead frame of an adjacent light emitting diode package in the second chain structure and the dummy lead frame of the light emitting diode package in the third chain structure.

16. The light source module of claim 15, wherein each dummy lead frame of each of the plurality of light emitting diode packages includes:
- a first dummy lead and a third dummy lead, each spaced apart from the anode lead;
- a second dummy lead spaced apart from the cathode lead, the second dummy lead being connected to the first dummy lead in the case through a first wire; and
- a fourth dummy lead spaced apart from the cathode lead and the second dummy lead, the fourth dummy lead being connected to the third dummy lead in the case through a second wire.

17. A backlight unit, comprising:
- a light source module;
- a light guiding plate at one side of the light source module, the light guiding plate being configured to guide light generated from the light source module; and
- an accommodation container configured to accommodate therein the light source module and the light guiding plate,
- wherein the light source module includes:
  - a printed circuit board;
  - a plurality of light emitting diode packages mounted on the printed circuit board, the plurality of light emitting diode packages alternating in a first chain structure and a second chain structure, each of the plurality of light emitting diode packages including a light emitting diode chip configured to generate light;
  - a case configured to accommodate therein the light emitting diode chip;
  - lead frames spaced apart from each other in the case, the lead frames including an anode lead and a cathode lead electrically connected to the light emitting diode chip; and
  - at least one dummy lead frame in the case, such that, if there is more than one dummy lead frame in each package, the dummy lead frames are physically spaced apart from each other and electrically connected to each other in the case to form a line, and
- wherein an output of the cathode lead in one light emitting diode package in the first chain structure is connected to the anode lead in another light emitting diode package in the first chain structure via the dummy lead frame of an adjacent light emitting interposing diode package in the second chain structure.

* * * * *